(12) United States Patent
Chiu

(10) Patent No.: US 9,521,779 B2
(45) Date of Patent: Dec. 13, 2016

(54) HEAT DISSIPATION APPARATUS

(71) Applicant: HON HAI PRECISION INDUSTRY CO., LTD., New Taipei (TW)

(72) Inventor: Hsien-Huan Chiu, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 14/500,342

(22) Filed: Sep. 29, 2014

(65) Prior Publication Data

US 2015/0271951 A1  Sep. 24, 2015

(30) Foreign Application Priority Data

Mar. 18, 2014  (TW) .............................. 103110067 A

(51) Int. Cl.
| | | |
|---|---|---|
| *H01T 23/00* | (2006.01) | |
| *H05F 3/00* | (2006.01) | |
| *H05K 7/20* | (2006.01) | |
| *G06F 1/20* | (2006.01) | |

(52) U.S. Cl.
CPC ............. *H05K 7/20172* (2013.01); *G06F 1/20* (2013.01); *G06F 1/203* (2013.01); *H01T 23/00* (2013.01)

(58) Field of Classification Search
CPC ...................................................... H01T 23/00
USPC .......................................................... 361/231
See application file for complete search history.

(56) References Cited

U.S. PATENT DOCUMENTS

| | | | | |
|---|---|---|---|---|
| 3,827,905 | A * | 8/1974 | Roth | G03G 13/08 |
| | | | | 361/233 |
| 8,159,809 | B2 * | 4/2012 | Gabara | B01L 3/5027 |
| | | | | 174/254 |
| 2009/0147434 | A1 * | 6/2009 | Gabara | H02N 13/00 |
| | | | | 361/233 |
| 2011/0116206 | A1 * | 5/2011 | Kim | H01L 23/467 |
| | | | | 361/231 |
| 2012/0007742 | A1 * | 1/2012 | Gooch | H01J 3/04 |
| | | | | 340/584 |
| 2014/0103793 | A1 * | 4/2014 | Nishida | H01T 19/04 |
| | | | | 313/231.71 |

FOREIGN PATENT DOCUMENTS

| | | |
|---|---|---|
| CN | 201541423 U | 8/2010 |
| CN | 202188560 | 4/2012 |
| CN | 101998804 B | 8/2012 |

* cited by examiner

*Primary Examiner* — Dharti Patel
(74) *Attorney, Agent, or Firm* — Zhigang Ma

(57) ABSTRACT

A heat dissipation apparatus includes an insulating plate, a conductive plate located on the insulating plate and a power source with an anode connected with the insulating plate and a cathode connected with the conductive plate. A conductive element is received in the insulating plate and is connected to the anode of the power source. When the heat dissipation apparatus is activated, the conductive element ionizes air closing to the insulating plate to produce positive ions. The conductive plate attracts the positive ions to move fast towards the conductive plate, which cause the air to flow in a direction in which the positive ions move.

10 Claims, 5 Drawing Sheets

HEAT DISSIPATION APPARATUS

FIELD

The present disclosure relates to electronic devices, and more particularly to a heat dissipation apparatus of an electronic device.

BACKGROUND

Fan modules are widely applied to the electronic devices, such as a computer, a DVD player, and a notebook computer, for heat dissipation.

BRIEF DESCRIPTION OF THE DRAWINGS

Implementations of the present technology will now be described, by way of example only, with reference to the attached figures, wherein.

DETAILED DESCRIPTION

Figure 1:
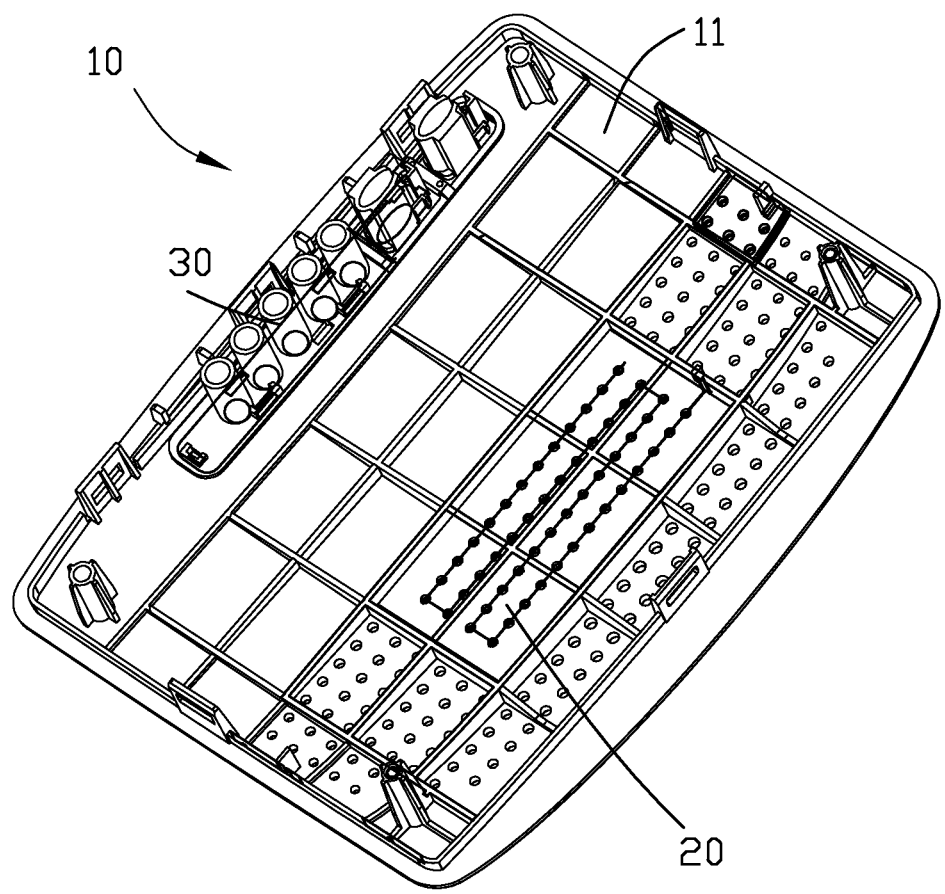
FIG. 1 is an isometric view of an embodiment of a heat dissipation apparatus of an electronic device.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Several definitions that apply throughout this disclosure will now be presented.

The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising," when utilized, means "including, but not necessarily limited to"; it specifically indicates open-ended inclusion or membership in the so-described combination, group, series and the like.

The following disclosure is described in relation to heat dissipation.

FIG. 1 illustrates an electronic device 10 of the disclosure. The electronic device 10 includes an enclosure 11, a number of electronic components 30, and a heat dissipation apparatus 20. The heat dissipation apparatus 20 is mounted in the enclosure 11 to dissipate heat generated by the electronic components 30.

Figure 2:
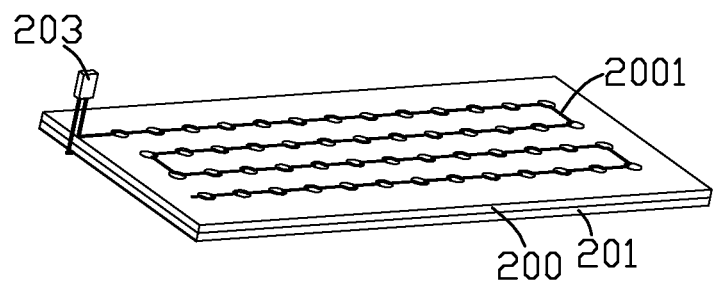
FIG. 2 is an isometric view of the heat dissipation apparatus of FIG. 1.
Figure 3:
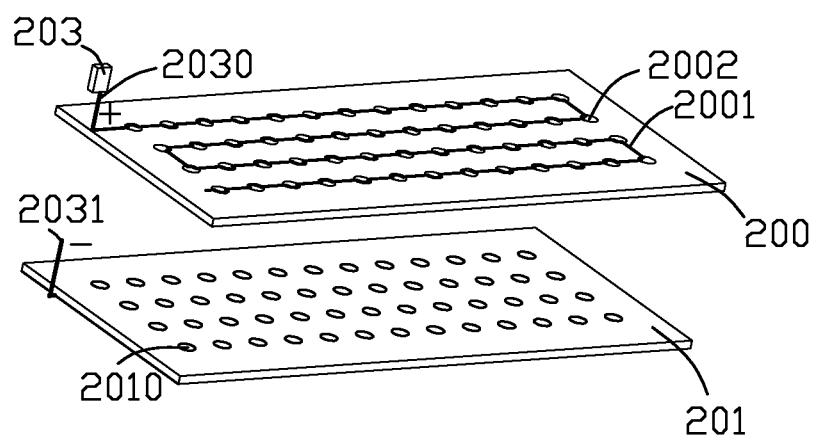
FIG. 3 is an exploded, isometric view of the heat dissipation apparatus having a conductive element of FIG. 2.

FIG. 2 and FIG. 3 illustrate that the heat dissipation apparatus 20 includes an insulating plate 200, a conductive plate 201, a conductive element 2001 and a power source 203. The insulating plate 200 is positioned substantially parallel to the conductive plate 201. The insulating plate 200 is not conductive. The insulating plate 200 defines a plurality of first through holes 2002 at equal intervals. The conductive plate 201 is capable of conducting electricity and defines a plurality of second through holes 2010 corresponding to the first through holes 2002. The conductive element 2001 is a wire with a diameter ranging from 0.025 mm to 0.050 mm. In the embodiment, the conductive element 2001 is positioned upon the insulating plate 200 and is arranged between the first through holes 2002 in series. In other embodiment, the conductive element 2001 is received in the insulating plate 200 and is arranged between the first through holes 2002 in series.

The power source 203 includes an anode 2030 and a cathode 2031. The anode 2030 is electrically connected to the conductive element 2001, and the cathode 2031 is electrically connected to the conductive plate 201. In the embodiment, the power source can provide high voltage through a transformer.

Figure 4:
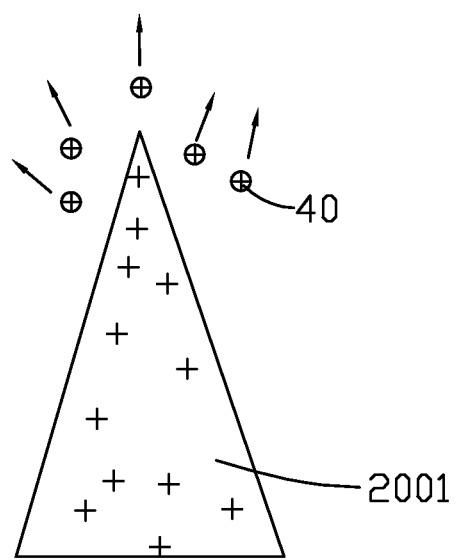
FIG. 4 is a diagrammatic view of discharge of a conductive element of FIG. 3.
Figure 5:
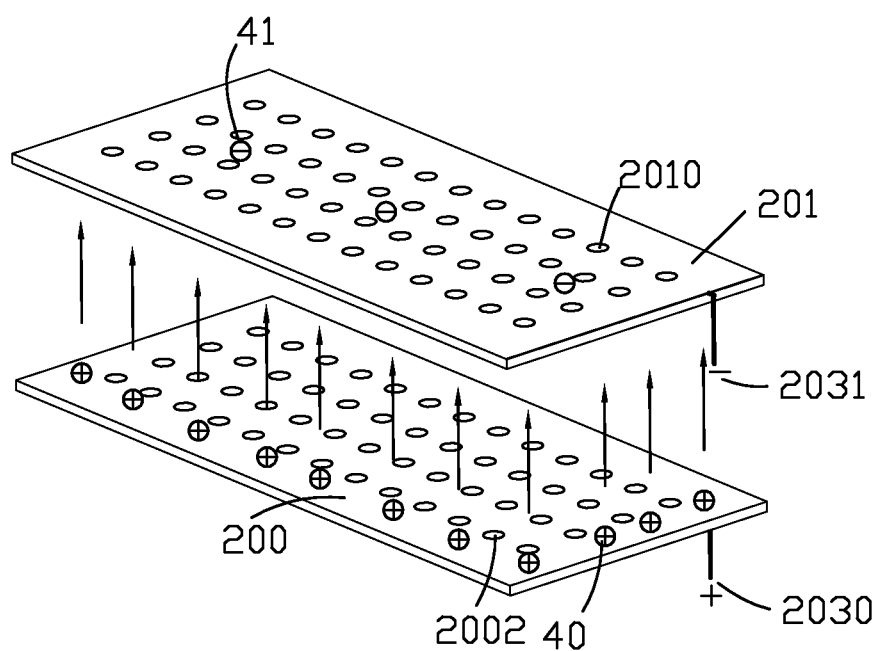
FIG. 5 is an isometric view of the heat dissipation apparatus creating forced convection of FIG. 3.

FIG. 4 and FIG. 5 illustrate that when the power source 203 is activated, an electric field is generated around the conductive element 2001 and the electric field is strong enough to cause the air around the conductive element 2001 to generate positive ions 40, and the conductive plate 201 generates negative icons 41. The positive ions 40 are moved toward the conductive plate 201 because the positive ions 40 generated by the conductive element 2001 and the negative icons 41 generated by the conductive plate 201, causing air to flow in a direction in which the positive ions 40 move. As a result, the air will flow from an inside to an outside of the enclosure 11 through the first through hole 2002 and the second through hole 2010 for dissipating the heat generated by the electronic device 10.

The embodiments shown and described above are only examples. Many details are often found in the art such as the other features of a shielding plate. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size and arrangement of the parts within the principles of the present disclosure up to, and including the full extent established by the broad general meaning of the terms used in the claims. It will therefore be appreciated that the embodiments described above may be modified within the scope of the claims.

What is claimed is:

1. A heat dissipation apparatus for dissipating heat by movement of air, comprising:
   a perforated non-conductive insulating plate;
   a perforated conductive plate; and
   a conductive element,
   wherein, the conductive element is positioned upon the non-conductive insulating plate;
   wherein, the heat dissipation apparatus is electrically connectable to a power source having an anode and a cathode, with the anode being electrically connected to the conductive element and the cathode being electrically connected to the conductive plate;

wherein, the non-conductive insulating plate is positioned substantially parallel to the conductive plate; and wherein, when the power source is activated, the conductive element generates an electric field producing positive ions in air and the conductive plate generates negative ions causing air movement towards the conductive plate.

2. The heat dissipation apparatus of claim 1, wherein the conductive element is a wire with a diameter ranging from 0.025 mm to 0.05 mm.

3. The heat dissipation apparatus of claim 2, wherein the insulating plate defines a plurality of first through holes, the conductive plate comprises a plurality of second through holes corresponding to the first through holes.

4. The heat dissipation apparatus of claim 3, wherein the wire is arranged between the first through holes in series.

5. An electronic device, comprising:
   an enclosure;
   a number of electronic components received in the enclosure; and
   a heat dissipation apparatus for dissipating heat by movement of air, comprising:
   a perforated non-conductive insulating plate;
   a perforated conductive plate; and
   a conductive element,
   wherein, the conductive element is positioned upon the non-conductive insulating plate;
   wherein, the heat dissipation apparatus is electrically connectable to a power source having an anode and a cathode, with the anode being electrically connected to the conductive element and the cathode being electrically connected to the conductive plate;
   Wherein, the non-conductive insulating plate is positioned substantially parallel to the conductive plate; and
   wherein, when the power source is activated, the conductive element generates an electric field producing positive ions in air and the conductive plate generates negative ions causing air movement towards the conductive plate.

6. The electronic device of claim 5, wherein the conductive element is a wire with a diameter ranging from 0.025 mm to 0.05 mm.

7. The electronic device of claim 6, wherein the insulating plate defines a plurality of first through holes, the conductive plate comprises a plurality of second through holes corresponding to the first through holes.

8. The electronic device of claim 7, wherein the wire is arranged between the first through holes in series.

9. The heat dissipation apparatus of claim 4, wherein the wire extends along a part of outline of the plurality of the first through holes.

10. The electronic device of claim 8, wherein the wire extends along a part of outline of the plurality of the first through holes.

* * * * *